United States Patent [19]
Takagi et al.

[11] Patent Number: 4,803,443
[45] Date of Patent: Feb. 7, 1989

[54] MICROWAVE POWER COMBINING FET AMPLIFIER

[75] Inventors: Tadashi Takagi; Kiyoharu Seino; Fumio Takeda, all of Kamakura, Japan

[73] Assignee: Mitsubishi Denki Kabushiki Kaisha, Tokyo, Japan

[21] Appl. No.: 177,738

[22] Filed: Apr. 5, 1988

[30] Foreign Application Priority Data

Apr. 10, 1987 [JP] Japan .................................. 62-87954

[51] Int. Cl.$^4$ ............................................. H03F 3/68
[52] U.S. Cl. .................................... 330/277; 330/286; 330/295
[58] Field of Search ................... 330/53, 57, 277, 286, 330/295; 333/127, 128

[56] References Cited

U.S. PATENT DOCUMENTS 3,963,993   6/1976   Hoffman et al. ................. 330/286 X

OTHER PUBLICATIONS

Bingham et al., "A Miniaturized 6.5–16 GHz Monolithic Power Amplifier Module", IEEE 1985 Microwave and Milimeter-Wave Monolithic Circuits Symp. Digest, pp. 38–41.
Takagi et al., "A 1.5 Watt 28 GHz Band FET Amplifier", 1984 IEEE MTT-S Digest, pp. 227–228.

*Primary Examiner*—James B. Mullins
*Attorney, Agent, or Firm*—Sughrue, Mion, Zinn, Macpeak and Seas

[57] ABSTRACT

A microwave power combining FET amplifier includes T-type input and output branch circuits 13, 14 for power splitting and combining, and interstage matching circuits 6a, 6b laterally connected at their mid-points a, b by a resistance circuit 15 which absorbs odd propagation mode waves reflected back from the output combiner due to non-uniformities between the post-stage FETs 4a, 4b.

6 Claims, 2 Drawing Sheets

MICROWAVE POWER COMBINING FET AMPLIFIER

BACKGROUND OF THE INVENTION

This invention relates to a microwave power combining FET amplifier using a microwave integrated circuit.

Typical such amplifiers are disclosed, for example, in T. Takagi et al, "A 1.5 Watt 28 GHz Band FET Amplifier", 1984 IEEE MTT-S Digest, pages 227–228, and in S. D. Bingham et al, "A Miniaturized 6.5–16 GHz Monolithic Power Amplifier Module", IEEE 1985 Microwave and Millimeter-Wave Monolithic Circuits Symp. Digest, pages 38–41. The former uses two two-stage amplifiers operated in parallel and branch-line couplers for power splitting/combining, and the latter uses four monolithic two-stage amplifiers operated in parallel and inter-digital couplers for power splitting/combining.

FIG. 1 is a circuit diagram of a microwave power combining FET amplifier as shown, for example, in the above-mentioned 1984 IEEE MTT-S Digest, wherein reference numeral 1 designates an input terminal, 2 is an output terminal, 3a and 3b are pre-stage FETs, 4a and 4b are post-stage FETs, 5a and 5b are input matching circuits, 6a and 6b are interstage matching circuits, 7a and 7b are output matching circuits, 8 is a power splitter, and 9 is a power combiner. The power splitter 8 and power combiner 9 use branch-line type couplers or Wilkinson type couplers.

In operation, microwave power inputted from terminal 1 is split by the power splitter 8, and an "upper" portion of the divided power is supplied to the combiner 9 through the input matching circuit 5a, pre-stage FET 3a, interstage matching circuit 6a, post-stage FET 4a, and output matching circuit 7a. The "lower" portion of the power is similarly supplied to the combiner 9 through the companion components 5b, 3b, 6b, 4b, and 7b. The split microwave powers are matched by the input interstage, and output matching circuits, amplified by the preand post-stage FETs, recombined in the power combiner 9, and outputted at terminal 2.

The power splitter 8 and power combiner 9 have internal resistance isolation circuits for absorbing reflected microwave power which propagates in an odd mode due to portions of the divided signals having equal amplitudes and opposite phases caused by non-uniformities between the individual FETs 3a, 3b, 4a, and 4b. As a result, the amplifier shown in FIG. 1 can be operated stably.

To provide such resistance isolation, however, branch-line couplers or Wilkinson couplers are required. This complicates the structure of the amplifier and impedes miniaturization.

SUMMARY OF THE INVENTION

This invention solves the above problem by providing a compact microwave power combining FET amplifier which does not include any branch-line or Wilkinson couplers in the power splitting and combining circuits, and yet which exhibits performance characteristics equivalent to those of the prior art.

The amplifier comprises T-type branch circuits for power splitting and combining, a plurality of multistage FETs, interstage matching circuits corresponding to the FETs, and a resistance circuit connected between opposing positions of the interstage matching circuits.

DETAILED DESCRIPTION OF THE PREFERRED EMBODIMENTS

Figure 1:
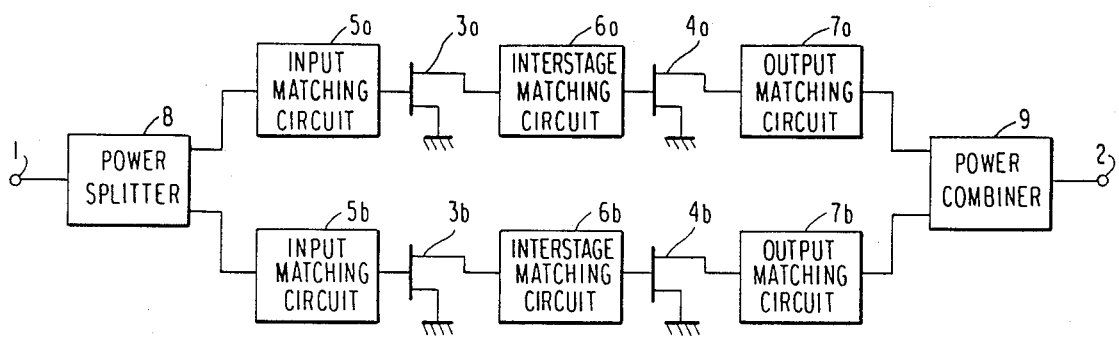
FIG. 1 is a circuit diagram of a prior art microwave power combining FET amplifier.
Figure 2:
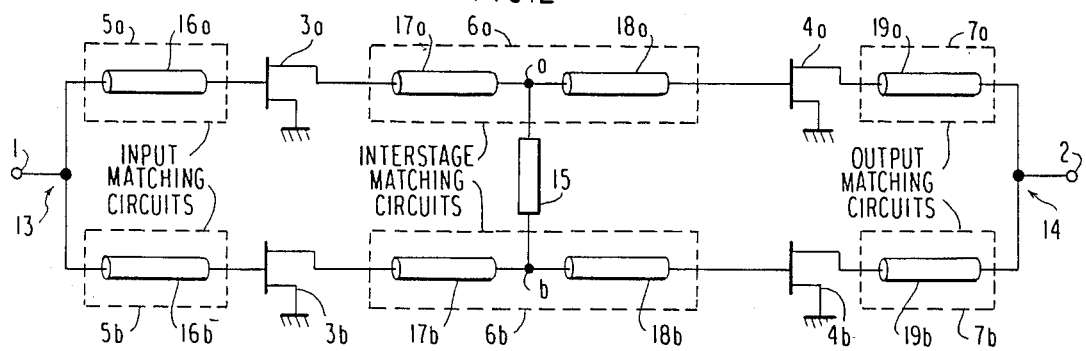
FIG. 2 is a circuit diagram showing a first embodiment of the invention.

Referring to FIG. 2, wherein identical reference numerals are used to designate corresponding elements in FIG. 1, input matching circuits 5a and 5b are constituted by distributed constant transmission lines 16a and 16b, respectively, interstage matching circuits 6a and 6b are respectively constituted by pairs of distributed constant transmission lines 17a, 18a, and 17b, 18b, and output matching circuits 7a and 7b are constituted by distributed constant transmission lines 19a and 19b. Between input terminal 1 and the input matching circuits 5a, 5b, a T-type branch circuit 13 is provided for power splitting, and a T-type branch circuit 14 is provided between output terminal 2 and the output matching circuits 7a, 7b for power combining. A resistance circuit 15 having a predetermined value is connected between positions a and b of the interstage matching circuits 6a and 6b. In a microwave integrated circuit, the distributed constant transmission lines 16a, 16b, 17a, 17b, 18a, 18b, 19a, and 19b are formed by microstrip lines having a single conductor strip disposed in parallel and close to a flat metallic plate.

In operation, microwave power inputted from terminal 1 is split by the T-type branch circuit 13, propagated through and amplified in the upper and lower paths as described above, and recombined in the T-type branch circuit 14 at the output end.

When there are non-uniformities in the characteristics of the FETs 3a, 3b, 4a, and 4b, the amplitudes and phases of the two microwaves which reach the output branch circuit 14 differ from each other. Generally, there are two types of microwave transmission modes, an odd mode in which the amplitudes of two waves are equal but their phases are opposite, and an even mode in which the amplitudes and phases of the two waves are equal to each other. Two input microwaves having the same amplitude and phase and propagating in the even mode are combined in the T-type branch circuit 14 and delivered to the output terminal 2. However, two input microwaves having the same amplitude and opposite phases and propagating in the odd mode are reflected at the output branch circuit. The reflected microwaves propagate back toward the input side, where they are again reflected by the branch circuit 13. Multiple reflections are thus repeated between the input and output branch circuits 13, 14, and the amplification characteristics are affected adversely. To avoid this problem predetermined positions a and b opposite each other in the interstage matching circuits 6a and 6b are connected by a resistance circuit 15, which eliminates the influence of multiple reflections.

To realize a high output, FETs having a large gate width and a high amplification factor are used for the post-stage FETs 4a and 4b as compared with the pre-stage FETs 3a and 3b, and such large gate width FETs are apt to exhibit large non-uniformities in their characteristics. Accordingly, for purposes of simplified explanation, referring to FIG. 3, it is assumed that the pre-stage FETs 3a and 3b have no non-uniform characteristics while the post-stage FETs 4a and 4b have large non-uniformities.

Figure 3:
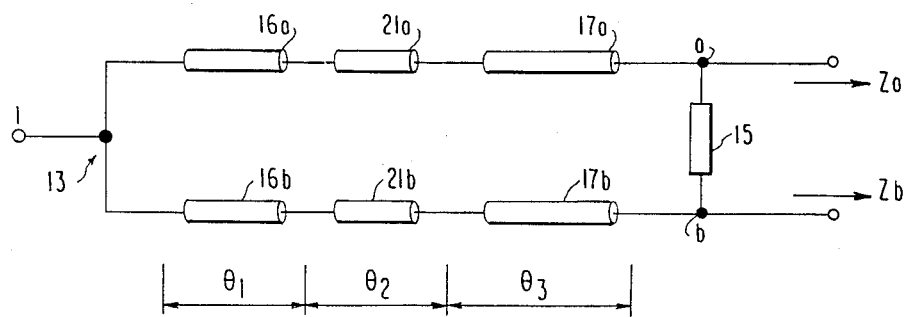
FIG. 3 is a circuit diagram for explaining the principles of operation of the first embodiment.

In FIG. 3, distributed constant transmission lines 21a and 21b represent the pre-stage FETs 3a and 3b, $\theta_1$ and $\theta_3$ are respective electrical angles due to the distributed constant transmission lines 16a, 16b and 17a and 17b, and $\theta_2$ is an electrical angle given by the relationship:

$$\theta_2 \approx \angle S_{12} \approx \angle S_{21},$$

among the S or scatter matrix parameters of the pre-stage FETs 3a and 3b. Here, $S_{12}$ and $S_{21}$ are elements of the expression:

$$S = \begin{pmatrix} S_{11} & S_{12} \\ S_{21} & S_{22} \end{pmatrix}.$$

Za and Zb are the impedances of the post-stage FETs 4a and 4b as viewed from points a and b.

The relationships among the electrical angles $\theta_1$, $\theta_2$, and $\theta_3$, and the relationships among the impedances Za, Zb, and Z, the impedance of the resistance circuit 15, are expressed by:

$$\theta_1 + \theta_2 + \theta_3 \approx 90° \quad (1), \text{ and}$$

$$Z/2 \approx Z_a^* \approx Z_b^* \quad (2),$$

where Za* and Zb* represent conjugate complexes of Za and Zb.

As may be seen from the relationships in formulas (1) and (2), the circuit of FIG. 3 can be regarded as being functionally equivalent to a Wilkinson type coupler. Accordingly, odd mode microwave power having the same amplitude and opposite phases reflected due to the non-uniformities in the characteristics of the post-Fets 4a and 4b is consumed by the resistance circuit 15, in a manner similar to that of a Wilkinson type coupler. In other words, when odd mode microwave power is reflected by the output branch circuit 14 back towards the input side, such reflection creates a potential difference across the resistance circuit 15, and the reflected power is thus fed through and consumed in the resistance circuit. If no non-uniformities are present in the FETs, the voltages applied to both ends of the resistance circuit 15 are equal and no current flows through it. Therefore, the resistance circuit does not affect even mode propagations which contribute to the amplification characteristic, but functions as an absorbing circuit for odd mode microwave power caused by multiple reflection, thereby suppressing any undesired oscillations or impediments in the amplification characteristics.

Figure 4:
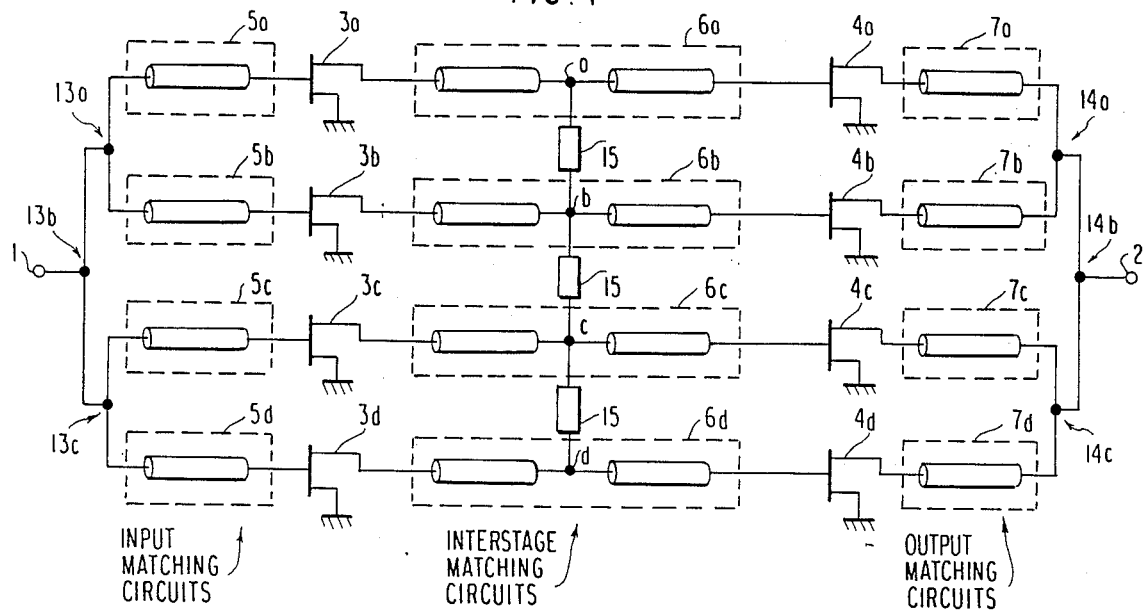
FIG. 4 is a circuit diagram showing a second embodiment of the invention.

In the second embodiment shown in FIG. 4, four multistage FET amplifiers are used, and corresponding parts to those shown in FIG. 2 are designated with identical reference numerals. In FIG. 4, reference numerals 3c and 3d designate pre-stage FETs, 4c and 4d are post-stage FETs, 5c and 5d are input matching circuits, 6c and 6d are interstage matching circuits, 7c and 7d are output matching circuits, and 13a, 13b, 13c, 14a, 14b, and 14c designate T-type branch circuits. The operation of this second embodiment is essentially the same as that of the first embodiment. Instead of four multistage FET amplifiers, three or five or more such amplifiers may be used.

Figure 5:
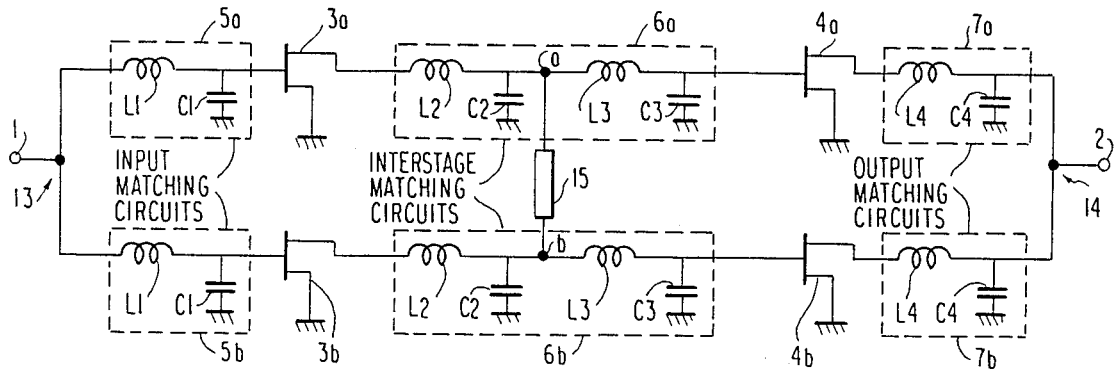
FIG. 5 is a circuit diagram showing a third embodiment of the invention.

The characteristic features of the third embodiment shown in FIG. 5 are that each of the input matching circuits 5a and 5b is formed by a coil L1 and a capacitor Cl, each of the interstage matching circuits 6a and 6b is formed by coils L2, L3, and capacitors C2, C3, and each of the output matching circuits 7a and 7b is formed by a coil L4 and a capacitor C4. In other words, the input, interstage, and output matching circuits are formed by concentrated constant circuit elements. The operation is essentially the same as in the first embodiment.

Figure 6:
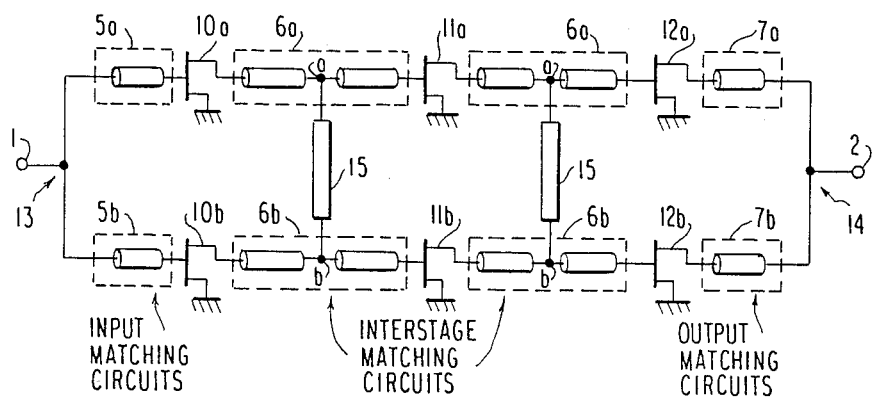
FIG. 6 is a circuit diagram showing a fourth embodiment of the invention.

In the fourth embodiment shown in FIG. 6, two three-stage FET amplifiers are used, and reference numerals 10a and 10b designate pre-stage FETs, 11a and 11b designate intermediate stage FETs, and 12a and 12b designate post-stage FETs. This embodiment may be formed by four-stage or more FET amplifiers.

The invention may be applied to a monolithic integrated circuit, and a plurality of FETs, input matching circuits, output matching circuits, interstage matching circuits, T-type branch circuits, and resistance circuits may be formed on the same semiconductor substrate.

What is claimed is:

1. A microwave power combining FET amplifier, comprising:
    (a) an input T-type branch circuit (13) for splitting a microwave input signal into two components,
    (b) a pair of multistage FET amplifiers connected in parallel, each of said amplifiers being formed by a microwave integrated circuit and comprising, in series, an input matching circuit (5a, 5b) connected to said branch circuit and receiving one of said split signal components, a pre-stage FET (3a, 3b), an interstage matching circuit (6a, 6b), a post-stage FET (4a, 4b), and an output matching circuit (7a, 7b),
    (c) an output T-type branch circuit (14) connected to said output matching circuits for combining said split signal components, and
    (d) a resistance circuit (15) having a predetermined resistance value connected between predetermined, opposite positions (a, b) of said interstage matching circuits for absorbing odd propagation mode microwaves reflected back from the output branch circuit due to non-uniformities between the characteristics of said amplifiers.

2. An amplifier according to claim 1, wherein each of said input matching circuits, said interstage matching circuits, and said output matching circuits is formed by a concentrated constant circuit element including a coil and a capacitor.

3. An amplifier according to claim 1, wherein each of said interstage matching circuits includes two stages connected in series through an intermediate stage FET (11a, 11b), and two resistance circuits (15) individually connected between midpoints of said stages.

4. An amplifier according to claim 1, wherein said microwave power combining FET amplifier is formed by a monolithic integrated circuit.

5. An amplifier according to claim 1, wherein each input matching circuit, interstage matching circuit, and output matching circuit comprises a distributed constant microstrip transmission line formed by a single conductor strip disposed parallel to and proximate a flat metallic plate.

6. An amplifier according to claim 1, wherein the post-stage FETs have larger gate widths and higher amplification factors than the pre-stage FETs.

* * * * *